(12) United States Patent
Chang

(10) Patent No.: US 8,946,085 B2
(45) Date of Patent: Feb. 3, 2015

(54) SEMICONDUCTOR PROCESS AND STRUCTURE

(75) Inventor: Wen-Hsiung Chang, Hsinchu (TW)

(73) Assignee: Ineffable Cellular Limited Liability Company, Wilmington, DE (US)

( * ) Notice: Subject to any disclaimer, the term of this patent is extended or adjusted under 35 U.S.C. 154(b) by 703 days.

(21) Appl. No.: 12/774,823

(22) Filed: May 6, 2010

(65) Prior Publication Data

US 2011/0272808 A1    Nov. 10, 2011

(51) Int. Cl.
*H01L 29/72* (2006.01)
*H01L 21/768* (2006.01)

(52) U.S. Cl.
CPC .... *H01L 21/76898* (2013.01); *H01L 21/76802* (2013.01); *H01L 21/76885* (2013.01)
USPC ............................ 438/674; 438/710; 438/745

(58) Field of Classification Search
USPC .......................................... 438/710, 674, 745
See application file for complete search history.

(56) References Cited

U.S. PATENT DOCUMENTS

| | | | |
|---|---|---|---|
| 4,250,004 A * | 2/1981 | Miles et al. | 205/511 |
| 4,834,844 A * | 5/1989 | Pliefke et al. | 205/115 |
| 2003/0232203 A1* | 12/2003 | Mutlu et al. | 428/451 |
| 2008/0105355 A1* | 5/2008 | Kumar et al. | 156/60 |
| 2009/0186480 A1* | 7/2009 | Goela et al. | 438/680 |
| 2010/0128456 A1* | 5/2010 | Hughes et al. | 361/818 |
| 2012/0261805 A1* | 10/2012 | Sundaram et al. | 257/666 |

* cited by examiner

*Primary Examiner* — Edward Wojciechowicz

(57) ABSTRACT

A semiconductor process includes the following steps. Firstly, a conductive substrate is provided. Then, at least one insulating pattern is formed on the conductive substrate. Thereafter at least one metal pattern is formed on the insulating pattern. After that, a passivation layer is formed on the conductive substrate to cover the metal pattern by an electroplating process.

13 Claims, 4 Drawing Sheets

FIB. 3B

SEMICONDUCTOR PROCESS AND STRUCTURE

BACKGROUND

1. Field

The present application relates to a semiconductor process and structure, and more particularly to a semiconductor process and structure with low manufacturing cost.

2. Description of the Related Art

With the development of the technology, semiconductor structure has been widely applied into various fields, such as integrated circuits and electronic products. Passivation layer is used as an insulating layer of the semiconductor structure, and is configured for insulating and protecting metal wires of the semiconductor structure, which is an indispensable layer of the semiconductor structure.

In a conventional semiconductor process, the passivation layer is generally made of photosensitive material or epoxy material, and a forming method thereof generally includes deposition process, photolithography and etching process. Since the photolithography and etching process has high cost, it is difficult to decrease the cost of the semiconductor process to a desirable scope.

BRIEF SUMMARY

An embodiment of the present invention relates to a semiconductor process with low cost.

An embodiment of the present invention also relates to a semiconductor structure with low cost.

A semiconductor process in accordance with an embodiment includes the following steps. Firstly, a conductive substrate is provided. Secondly, at least one insulating pattern is formed on the conductive substrate. Thirdly, at least one metal pattern is formed on the insulating pattern and then a passivation layer is formed on the conductive substrate by performing a first electroplating process to cover the metal pattern.

In an exemplary embodiment of the present invention, a sacrificial layer is further formed on a part of the metal pattern before forming the passivation layer, and the sacrificial layer is removed for forming an open to expose the part of the metal pattern after forming the passivation layer. A method for removing the sacrificial layer may be plasma etching process or wet etching process.

In an exemplary embodiment of the present invention, the metal pattern is formed on the insulating pattern by forming an electroplating seed layer on the conductive substrate to cover the insulating pattern, forming a patterned photosensitive layer on the electroplating seed layer to expose a part of the electroplating seed layer on the insulating pattern, and employing the part of the electroplating seed layer which is exposed, for performing a second electroplating process to form the metal pattern. In addition, after forming the metal pattern and before forming the passivation layer, the patterned photosensitive layer and the electroplating seed layer which is remained on the conductive substrate are further removed. For example, the electroplating seed layer which is remained on the conductive substrate is removed by wet etching process.

In an exemplary embodiment of the present invention, the conductive substrate is a silicon substrate.

A semiconductor process in accordance with another exemplary embodiment of the present invention includes the following steps. Firstly, a conductive substrate is provided. Secondly, the conductive substrate is used as an electrode for performing an electroplating process to form a passivation layer on the conductive substrate. Preferably, the conductive substrate is a silicon substrate.

A semiconductor structure in accordance with other exemplary embodiment of the present invention includes a conductive substrate, at least one insulating pattern, at least one metal pattern and a passivation layer. The insulating pattern is disposed on the conductive substrate. The metal pattern is disposed on the insulating pattern. The passivation layer is formed on the conductive substrate by an electroplating process and covers the metal pattern.

In an exemplary embodiment of the present invention, the passivation layer has an opening exposing a part of the metal pattern.

In an exemplary embodiment of the present invention, the conductive substrate is a silicon substrate.

In an exemplary embodiment of the present invention, the metal pattern is a metal complex layer, such as Cu/Ni/Au or Al/Ni/Au.

In an exemplary embodiment of the present invention, a material of the passivation layer includes an electrophoretic paint.

The semiconductor process of an embodiment employs the electroplating process to form the passivation layer, and employs the method of forming the sacrificial layer on the metal pattern and removing the sacrificial layer after forming the passivation layer, to form the opening in the passivation layer. Compared with the conventional method of the photolithograph and etching process to form the passivation layer, the embodiment can greatly decrease the cost of the semiconductor process.

BRIEF DESCRIPTION OF THE DRAWINGS

These and other features and advantages of the various embodiments disclosed herein will be better understood with respect to the following description and drawings, in which like numbers refer to like parts throughout, and in which:

FIGS. 3A-3D are flow-chart schematic views of a semiconductor process in accordance with another exemplary embodiment of the present invention.

DETAILED DESCRIPTION

Reference will now be made to the drawings to describe exemplary embodiments of the present semiconductor process and structure in detail. The following description is given by way of example, and not limitation.

Figure 1A:
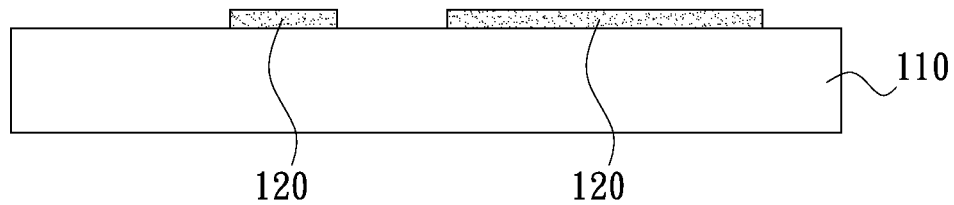
FIGS. 1A-1C are flow-chart schematic views of a semiconductor process in accordance with an exemplary embodiment of the present invention.
Figure 1B:
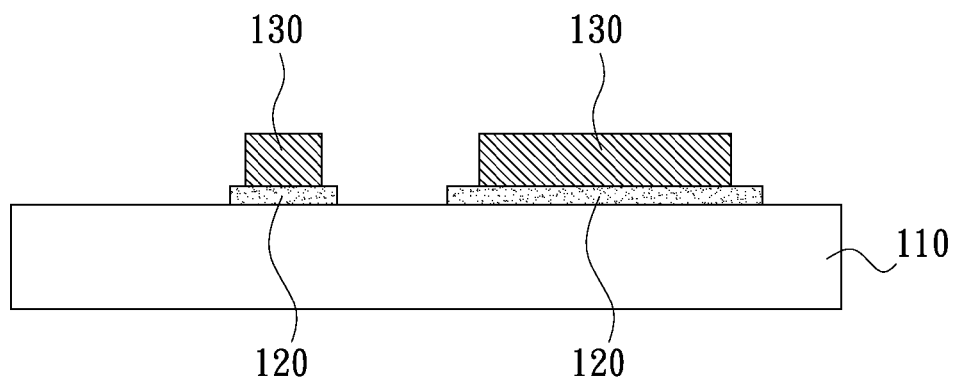
Figure 1C:
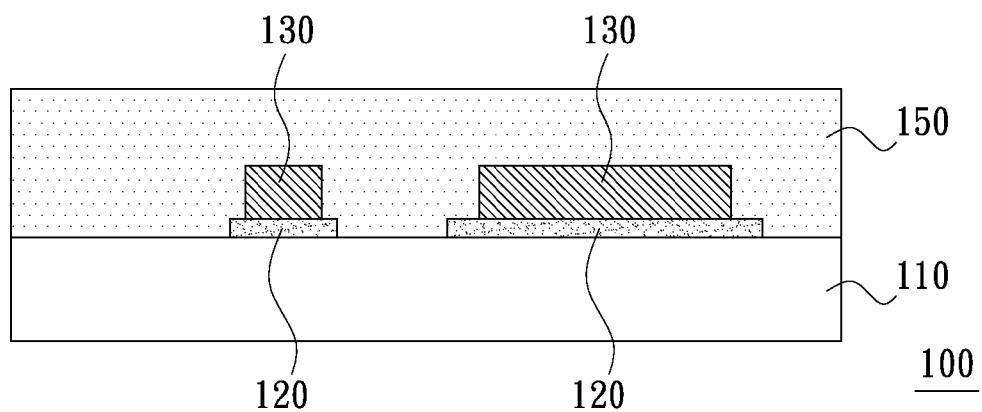

Refer to FIGS. 1A to 1C, which are schematic view of a semiconductor process in accordance with an exemplary embodiment of the present invention.

Refer to FIG. 1A, a conductive substrate 110 is provided, such as a silicon substrate. Then, at least one insulating pattern 120 is formed on the conductive substrate 110. In detail, the exemplary embodiment may coat a layer of insulating material (not shown) on the whole conductive substrate 110 firstly, then employ a photolithography and etching process to etch the layer of the insulating material to form the at least one insulating pattern 120. In the exemplary embodiment, the insulating material is etched to form a plurality of insulating patterns 120.

Figure 2A:
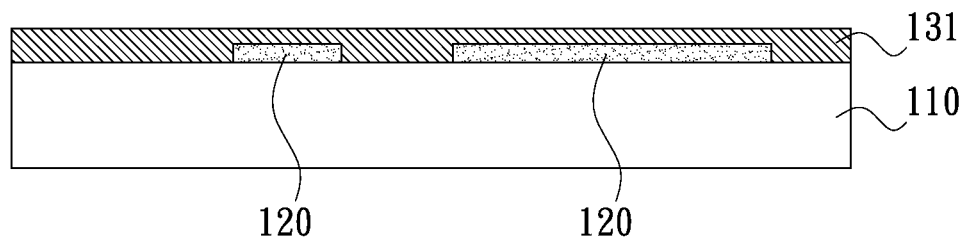
FIGS. 2A-2C are flow-chart schematic views of an electroplating process to form metal patterns in accordance with an exemplary embodiment of the present invention.
Figure 2B:
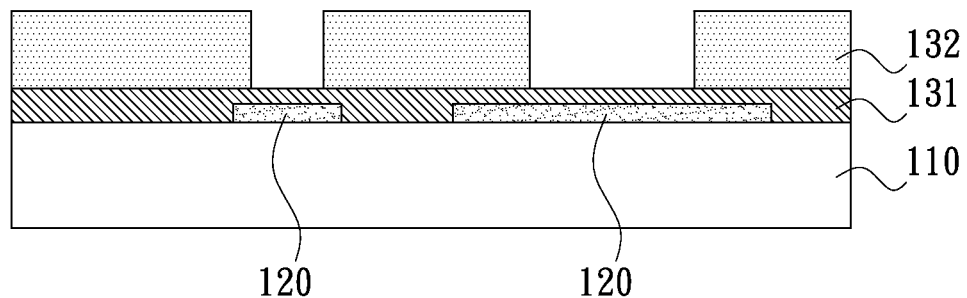
Figure 2C:
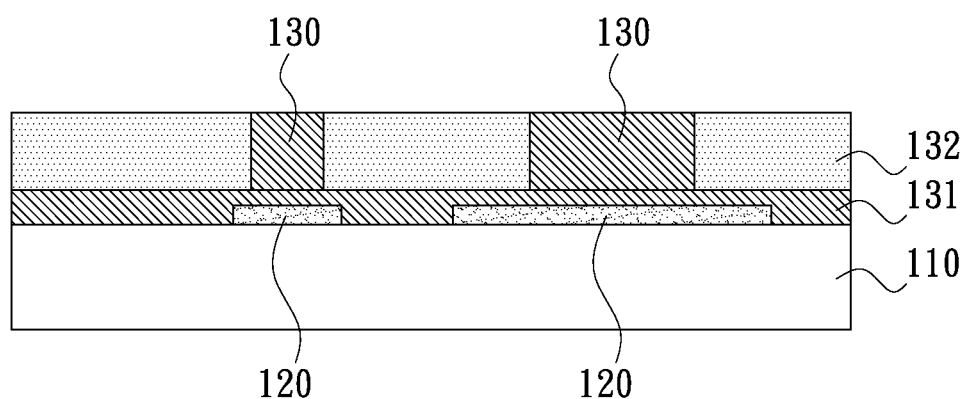

Please continue to refer to FIG. 1B, metal patterns 130 are formed on the insulating patterns 120. More particularly, the metal patterns 130 may be formed by an electroplating process. In detail, refer to FIGS. 2A-2C, which are cross-sectional schematic view of processing the metal pattern in the exemplary embodiment. As shown in FIG. 2A, an electroplating seed layer 131 is firstly formed on the conductive substrate 110 to cover the insulating patterns 120. Then, as shown in FIG. 2B, a patterned photosensitive layer 132 is formed on the electroplating seed layer 131 to expose parts of the electroplating seed layer 131 which are disposed on the insulating patterns 120. Thereafter, as shown in FIG. 2C, the exposed parts of the electroplating seed layer 131 are employed to perform an electroplating process. After that, the patterned photosensitive layer 132 and the electroplating seed layer 131 remained on the conductive substrate 110 are removed to form the metal patterns 130 as shown in FIG. 1B. In this embodiment, the electroplating seed layer 131 remained on the conductive substrate 110 may be removed by an etching process, such as a wet etching process.

In addition, each metal pattern 130 of the exemplary embodiment may be a metal complex layer, such as a Cu/Ni/Au complex layer or an Al/Ni/Au complex layer, which can change electrolytic solution to form the metal patterns 130 with the metal complex layer.

Of course, it is obvious for persons skilled in the art that, the metal pattern 130 also may be formed by general sputtering or chemical deposition process performed with photolithograph process and etching process.

Refer to FIG. 1C, after forming the metal patterns 130, the conductive substrate 110 is then employed as an electrode to perform an electroplating process, such to form a passivation layer 150 on the conductive substrate 110 to cover the metal patterns 130. Thus the process of the semiconductor structure 100 is substantially finished. In detail, the passivation layer 150 is made of electrophoretic paint or other insulating material which can be formed as a layer by electroplating process. Since the material of the passivation layer 150 can resist acids, alkalis, corrosion, heat and water, the passivation layer 150 can effectively protect the metal patterns 130, and avoid the metal patterns 130 from damaging by various exterior mattes.

During a manufacturing process of a semiconductor device electrically connecting to extra circuit by through silicon via (TSV), the insulating pattern 120 can be formed in the same process of forming an insulating layer of the TSV and the metal pattern 130 can be formed in the same process of forming a metallic layer of the TSV. An embodiment is described in detail in the following paragraphs.

Figure 3A:
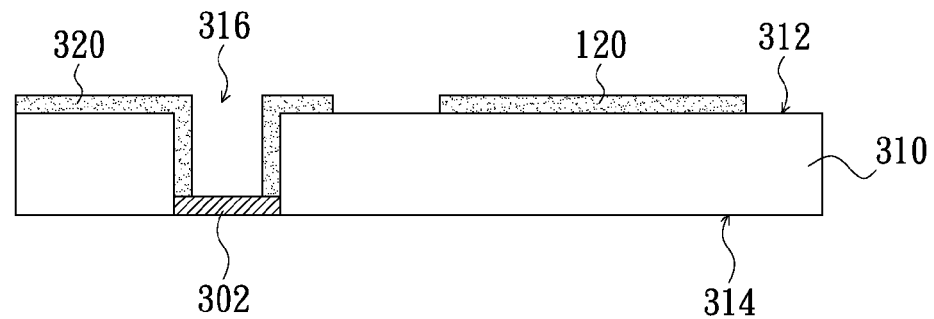

Refer to FIGS. 3A to 3D, which are schematic views of a semiconductor process in accordance with another exemplary embodiment of the present invention. As shown in FIG. 3A, a conductive substrate 310 having at least one through hole 316 through from a back surface 312 of the conductive substrate 310 to an active surface 314 of the conductive substrate 310 is provided. Further, at least one bonding pad 302 has been formed on the active surface 314, and the through hole 316 corresponds the bonding pad 302. Next, at least one insulating pattern 120 and an insulating layer 320 covering sidewalls of the through hole 316 are formed on the back surface 312 of the conductive substrate 310. Specifically, the exemplary embodiment may coat a layer of insulating material (not shown) on the whole conductive substrate 310 firstly, then employ a photolithography and etching process to etch portions of the layer of the insulating material on the back surface 312 of the conductive substrate 310 and on the bottom of the through hole 316 to form the at least one insulating pattern 120 and the insulating layer 320.

Referring to FIG. 3B, a metal pattern 130 is formed on the insulating patterns 120 and a metallic layer is formed simultaneously on the back surface of the conductive substrate 310 and filling into the through hole 316. The method of forming the metal pattern 130 and the metallic layer 330 is similar with or the same as the aforementioned embodiment, such as electroplating, sputtering or chemical deposition with lithography and etching process.

Figure 3C:
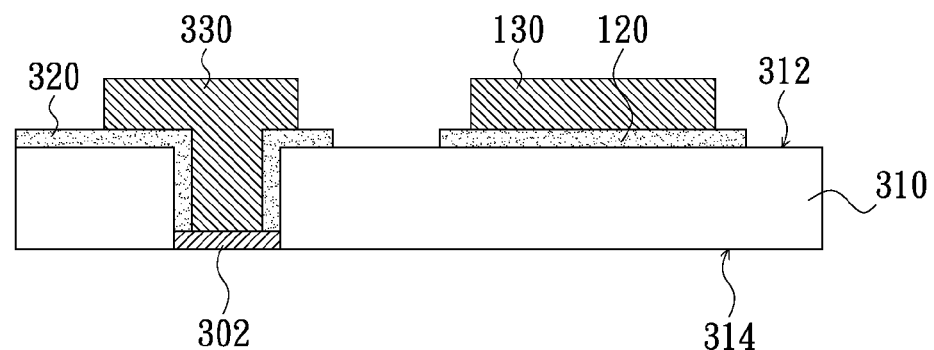
Figure 3C:
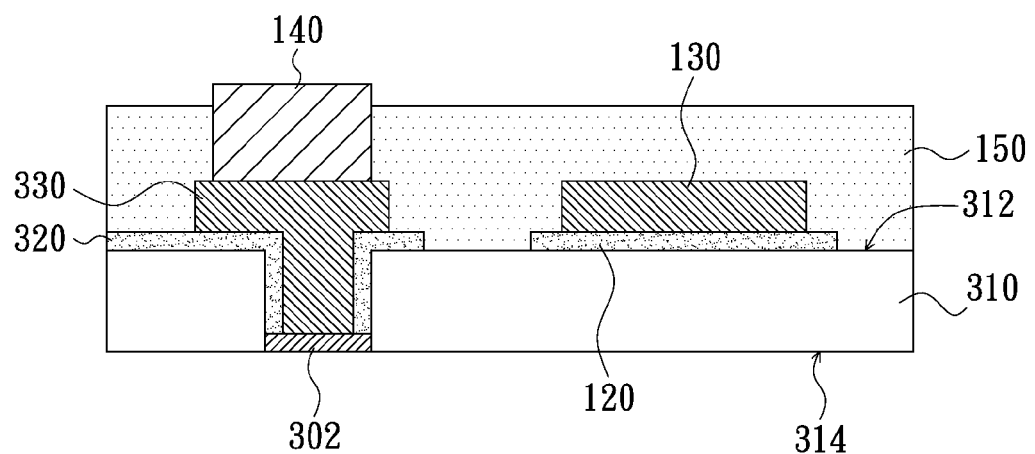

Referring to FIG. 3C, a sacrificial layer 140 is formed on a part of the metallic layer 330, and material thereof may be polymeric material. Then, the conductive substrate 310 is employed as the electrode to perform the electroplating process for forming the passivation layer 150 on the conductive substrate 310 to cover the metal pattern 130 which is not covered by the sacrificial layer 140.

Figure 3D:
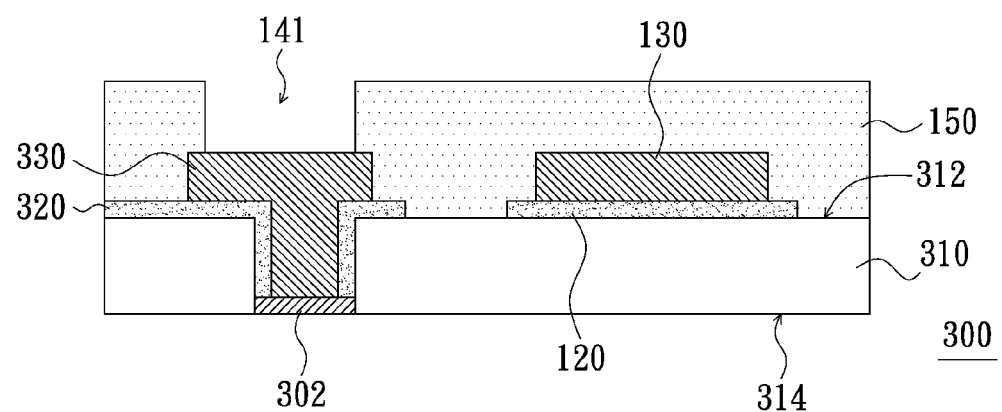

Thereafter, as shown in FIG. 3D, the sacrificial layer 140 is removed for forming an opening 141 to expose a part of the metallic layer 330. Thus it substantially completes the process of the semiconductor structure 300. The sacrificial layer 140 may be removed by plasma etching process or wet etching process.

From the above description, it is obvious that the opening 141 of the semiconductor structure 300 may be configured for filling a conductive structure (not shown) in a following process, which is electrically connected to the metallic layer 330, such as via or solder ball, to make the bonding pad 302 be electrically connected to extra circuits through the metallic layer 330 and the conductive structure.

It should be noted that, although the exemplary embodiments then employs the conductive substrate 110/conductive substrate 310 as the electrode to perform the electroplating process to form the passivation layer 150 after forming the insulating patterns 120/insulating layer 320 and the metal patterns 130/metallic layer 330 on the conductive substrate 110/conductive substrate 310, it is only an exemplary embodiment of the present invention. The present invention does not limit whether forming any layer on the conductive substrate 110/conductive substrate 310 before forming the passivation layer 150, and it is in the scope of the present invention to employ the conductive substrate 110/conductive substrate 310 as the electrode to perform the electroplating process.

In summary, the semiconductor process of the present invention employs the electroplating process to form the passivation layer, and employs the method of forming the sacrificial layer on the metal pattern and removing the sacrificial layer after forming the passivation layer, to form the opening in the passivation layer. Compared with the conventional method of the photolithograph and etching process to form the passivation layer, the present invention can greatly decrease the cost of the semiconductor process.

Furthermore, the present invention employs the insulating material which can be formed as the passivation layer by electroplating process, and the material of the passivation layer can resist acids, alkalis, corrosion, heat and water, thus it can effectively protect the metal pattern from damaging in the following process, and improve the manufacturing yield of the semiconductor process.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of processing a semiconductor, the method comprising:
    forming a conductive substrate having at least one through hole from a back surface of the conductive substrate to an active surface of the conductive substrate;
    forming at least one bonding pad on the active surface of the conductive substrate;
    forming an insulating pattern on the conductive substrate, wherein the insulating pattern is formed on side walls of the at least one through hole;
    forming a metal pattern on the insulating pattern; and
    performing a first electroplating process to form a passivation layer covering the metal pattern, wherein the passivation layer includes an insulative material.

2. The method of claim 1, further comprising:
    forming a sacrificial layer on the metal pattern before forming the passivation layer; and
    after forming the passivation layer, removing the sacrificial layer to form an opening through the passivation layer to expose at least a portion of the metal pattern.

3. The method of claim 2, wherein said removing the sacrificial layer comprises using a plasma etching process or a wet etching process.

4. The method of claim 1, wherein said forming a metal pattern on the insulating pattern comprises:
    forming an electroplating seed layer on the conductive substrate to cover the insulating pattern;
    forming a patterned photosensitive layer on the electroplating seed layer to expose a part of the electroplating seed layer on the insulating pattern; and
    employing the part of the electroplating seed layer which is exposed to perform a second electroplating process to form the metal pattern.

5. The method of claim 4, further comprising, after said forming a metal pattern and before forming the passivation layer:
    removing the patterned photosensitive layer; and
    removing the electroplating seed layer remaining on the conductive substrate.

6. The method of claim 5, wherein said removing the electroplating seed layer remaining on the conductive substrate comprises using a wet etching process.

7. The method of claim 1, wherein the conductive substrate comprises a silicon substrate.

8. A method of processing a semiconductor, the method comprising:
    providing a conductive substrate having at least one through hole from a back surface of the conductive substrate to an active surface of the conductive substrate;
    providing at least one bonding pad on the active surface of the conductive substrate;
    providing an insulating pattern on the conductive substrate;
    providing a metal pattern on the insulating pattern, wherein the insulating pattern is on the conductive substrate and on side walls of the at least one through hole; and
    employing the conductive substrate as an electrode to perform an electroplating process to form a passivation layer on the conductive substrate, wherein the passivation layer covers the metal pattern, and wherein the passivation layer includes an insulating material.

9. The method of claim 8, wherein the conductive substrate comprises a silicon substrate.

10. The method of claim 1, wherein the passivation layer comprises an electrophoretic paint.

11. The method of claim 8, wherein the passivation layer comprises an electrophoretic paint.

12. The method of claim 1, wherein said performing a first electroplating process comprises forming the passivation layer directly on the conductive substrate.

13. The method of claim 8, wherein said employing the conductive substrate as an electrode to perform an electroplating process comprises forming the passivation layer in direct contact with the conductive substrate.

* * * * *